United States Patent [19]
Ikeda

[11] Patent Number: 5,953,380
[45] Date of Patent: Sep. 14, 1999

[54] NOISE CANCELING METHOD AND APPARATUS THEREFOR

[75] Inventor: Shigeji Ikeda, Tokyo, Japan

[73] Assignee: NEC Corporation, Tokyo, Japan

[21] Appl. No.: 08/872,372

[22] Filed: Jun. 10, 1997

[30] Foreign Application Priority Data

Jun. 14, 1996 [JP] Japan ..................................... 8-153816

[51] Int. Cl.$^6$ .............................. H03D 1/04; H03D 1/06; H03K 5/01; H03K 6/04
[52] U.S. Cl. .......................... 375/346; 375/232; 704/233; 381/94.1
[58] Field of Search .................................... 375/346, 232, 375/254, 285, 284, 278, 296, 350; 381/94, 71, 94.7, 94.1, 93, 71.1, 71.11, 83, 66; 364/724.19; 379/406, 410; 455/296; 704/233

[56] References Cited

U.S. PATENT DOCUMENTS

| 4,658,426 | 4/1987 | Chabries et al. .......................... 381/94 |
| 4,939,685 | 7/1990 | Feintuch ............................. 364/724.19 |
| 5,402,496 | 3/1995 | Soli et al. .................................. 381/94 |
| 5,473,702 | 12/1995 | Yoshida et al. ........................... 381/94 |
| 5,475,632 | 12/1995 | Sugiyama ................................ 364/825 |
| 5,608,804 | 3/1997 | Hirano ..................................... 381/71 |

OTHER PUBLICATIONS

B. Widrow, et al. "Adapative Noise Cancelling: Principles and Applications", Proceedings of IEEE, vol. 63, No. 12, 1975, pp. 1692–1716.

Nagumo, et al. "A Learning Method for System Identification", IEEE Transactions on Automatic Control, vol. AC12, No. 3, 1967, pp. 282–287.

Harris, et al. "A Variable Step (VS) Adaptive Filter Algorithm", IEEE Transactions on Acoustics, Speech, and Signal Processing, vol. 34, No. 2, 1986, pp. 309–316.

Primary Examiner—Jason Chan
Assistant Examiner—Jean B Corrielus
Attorney, Agent, or Firm—Whitham, Curtis & Whitham

[57] ABSTRACT

In accordance with the present invention, for noise cancellation, a reference noise signal is input to signal-to-noise (SN) power ratio estimating circuitry via a reference signal input terminal. The SN power ratio estimating circuitry causes its adaptive filter for producing a pseudonoise signal from the reference noise signal to operate. The circuitry detects error signal power and pseudonoise signal power out of the pseudonoise signal and other signals, and then outputs an estimate of an SN power ratio based on the detected power. A first delay circuit is connected to the output terminal of the above circuitry. A comparator compares an estimate of an input to and an estimate of an output from the first delay circuit, and produces greater one of the two estimates as an expanded estimate. A step size output circuit controls, based on the expanded estimate, the step size of a second adaptive filter connected to the reference signal input terminal via a second delay circuit. A subtracter subtracts a pseudonoise signal output from the second adaptive filter from a received signal sequentially delayed by a third and a fourth delay circuit, thereby cancelling a background noise signal component contained in the received signal.

6 Claims, 3 Drawing Sheets

NOISE CANCELING METHOD AND APPARATUS THEREFOR

BACKGROUND OF THE INVENTION

The present invention relates to a noise canceling method and an apparatus therefor and, more particularly, to a method of canceling background noise introduced into a speech signal input via, e.g., a microphone or a handset by using an adaptive filter, and an apparatus therefor.

Background noise introduced into a speech signal of the kind described is critical when it comes to, e.g., a narrow band speech coding device or a speech recognizing device having a high data compression degree. A noise canceler for canceling noise components acoustically superposed on a speech signal has been proposed in various forms in the past. For example, a biinput noise canceler using an adaptive filter is disclosed in B. Widrow et al. "Adaptive Noise Cancelling: Principles and Applications", Proceedings of IEEE, Vol. 63, No. 12, 1975, pp. 1692–1716 (Document 1 hereinafter). The adaptive filter of Document 1 approximates the impulse response of a noise path along which a noise signal input to a reference input terminal is propagated to a speech input terminal. As a result, a pseudonoise signal corresponding to a noise signal component input to the speech input terminal appears on the output terminal of the adaptive filter. The pseudonoise signal is subtracted from a received signal, i.e., mixture of speech signal and noise signal input to the speech input terminal. With such a procedure, the noise canceler suppresses the noise signal.

The filter coefficient of the above adaptive filter is corrected on the basis of a relation between an error signal produced by subtracting the pseudonoise signal from the received signal and the reference signal input to the reference input terminal. Typical of algorithms for the correction or convergence of the filter coefficient are an LMS algorithm taught in Document 1 and LIM (Learning Identification Method) taught in IEEE TRANSACTIONS ON AUTOMATIC CONTROL, Vol. 12, No. 3, 1967, pp. 282–287 (Document 2 hereinafter).

FIG. 3 shows a specific prior art noise canceler. As shown, the noise canceler includes a speech input terminal 1 and a reference input terminal 2. An acoustic speech input to, e.g., a microphone located in the vicinity of the talker's mouth is transformed to an electric speech signal and then input to the speech input terminal 1. The speech signal contains background noise. On the other hand, an electric signal output from another microphone remote from the above talker is, in essence, a noise signal for the input terminal 1 and is input to the reference input terminal 2.

The mixture of speech signal and noise signal input to the speech input terminal 1 (received signal hereinafter) is fed to a delay circuit 3. The delay circuit 3 delays the received signal by a period of time of $\Delta t1$ and applies the delayed received signal to a subtracter 5. The delay circuit 3 is inserted in order to satisfy causality; the delay $\Delta t1$ is usually selected to be one half of the number of taps of an adaptive filter 4. On the other hand, the noise signal input to the reference input terminal 2 is fed to the adaptive filter 4 as a reference noise signal. The adaptive filter 4 filters the reference noise signal and outputs a pseudo noise signal. The pseudonoise signal is delivered to the subtracter 5.

The subtracter 5 subtracts the pseudonoise signal output from the adaptive filter 4 from the delayed received signal output from the delay circuit 3. As a result, the noise signal component contained in the received signal is cancelled. The resulting output of the subtracter 5 is delivered to an output terminal 6 and is applied to the adaptive filter 4 as an error signal. The adaptive filter 4 sequentially updates its filter coefficient on the basis of the. reference noise signal and error signal as well as a preselected step size $\alpha$. To update the filter coefficient, use is made of the LMS algorithm or LIM mentioned earlier.

Assume that the received signal input to the speech input terminal 1 contains a speech signal component s(k) (k being an index representative of time) and a noise signal component n(k) to be canceled, and that the delay $\Delta t1$ of the delay circuit 3 is zero. Then, a received signal y(k) routed through the speech input terminal 1 to the subtracter 5 is expressed as:

$$y(k)=s(k)+n(k) \tag{1}$$

The adaptive filter 4 receives a reference noise signal x(k) via the reference input terminal 2 and generates a pseudonoise signal r(k) corresponding to the noise signal component n(k) included in the above equation (1). The subtracter 5 subtracts the pseudonoise signal r(k) from the received signal y(k) so as to produce an error signal e(k). Let additional noise components be neglected because they are sufficiently smaller than the speech signal component s(k). Then, the error signal e(k) may be expressed as:

$$e(k)=s(k)+n(k)-r(k) \tag{2}$$

Assume that the LMS algorithm of Document 1 is used to update the filter coefficient of the adaptive filter 4, and that the "j" coefficient of the adaptive filter 4 at a time k is $w_j(k)$. Then, the pseudonoise signal r(k) output from the adaptive filter 4 is produced by:

$$r(k) = \sum_{j=0}^{N-1} w_j(k) \cdot x(k-j) \tag{3}$$

where N denotes the number of taps of the adaptive filter 4.

By applying the pseudonoise signal produced by the equation (3) to the equation (2), there is produced the error signal e(k). With the error signal e(k), it is possible to produce a filter coefficient $w_j(k+1)$ at a time (k+1), as follows:

$$w_j(k+1)=w_j(k)+\alpha \cdot e(k) \cdot x(k-j) \tag{4}$$

where $\alpha$ denotes a step size or constant playing the role of a parameter for determining the converging time of the coefficient and an error to remain after convergence.

On the other hand, in accordance with LIM of Document 2, the filter coefficient is updated by:

$$w_j(k+1) = w_j(k) + \frac{\mu \cdot e(k) \cdot x(k-1)}{\sum_{m=k-N+1}^{k} (x(m))^2} \tag{5}$$

where $\mu$ denotes a step size inversely proportional to the mean power of the reference noise signal x(k) input to the adaptive filter.

When the step size $\alpha$ or $\mu$ is great, rapid convergence is achievable because the filter coefficient is corrected in a great amount. However, if any interference component obstructing the updating of the coefficient is present, then its influence is aggravated due to the great amount of correction, resulting in an increase in residual error. When the step size $\alpha$ or $\mu$ is small, the influence of the interference component and therefore the residual error is reduced although the converging time increases. This indicates that trade-off exists between the converging time and the residual error.

In the noise canceler, the adaptive filter 4 is used to produce the pseudo signal component r(k) of the noise signal component n(k). Therefore, the error signal for updating the coefficient of the filter 4 must be implemented as a difference between n(k) and r(k), i.e., a residual error (n(k)−r(k)). However, as the equation (2) indicates, the error signal e(k) contains the speech signal component s(k). The speech signal component s(k) turns out an interference signal component when it comes to the updating of the coefficient of the filter 4.

To reduce the influence of the speech signal component s(k), it is necessary that the step size for updating the coefficient of the filter 4 be extremely small. This, however, brings about the problem that the convergence of the filter 4 is slowed down.

In light of the above, there has been proposed a method which, when a speech signal is detected on the basis of the result of comparison between the mean power of the received signal y(k) and the reference noise signal x(k), stops updating the coefficient, instead of selecting a relatively great step size. However, because the detection of the speech signal s(k) depends on a threshold, it is likely that the detection of the signal s(k) is delayed and increases the residual error, depending on the relation in size between the signal s(k) and the noise signal x(k), or that the updating operation stops despite the absence of the signal s(k) and delays the convergence. Moreover, when the speech signal s(k) is present, the filter 4 cannot follow the variation of the system due to the stop of the updating operation.

A VS algorithm disclosed in IEEE TRANSACTIONS ON ACOUSTIC SPEECH AND SIGNAL PROCESSING, Vol. 34, No. 2, 1986, pp. 309–316(Document 3 hereinafter) is an implementation for solving the above problems. The VS algorithm assigns a particular step size to each filter coefficient provided by a step size matrix, and sequentially varies the step size within a control range. Specifically, this algorithm halves the step size when the polarity of the slope component of the filter coefficient changes $m_0$ consecutive times, or doubles it when the polarity does not change $m_1$ consecutive times. The maximum step size and minimum step size are respectively determined by the reciprocal $1/\lambda$ of the maximum eigenvalue of the autocorrelation matrix and the amount of error remaining after convergence.

The VS algorithm assigns to the individual filter coefficient steps sizes corresponding to irregularities in the components of the autocorrelation matrix in order to enhance rapid convergence. At the same time, this algorithm determines the converging condition of the filter coefficient in terms of the slope of the filter coefficients, and reduces the step size in order to reduce the residual error.

However, even with the VS algorithm, the error signal for updating the coefficient of the adaptive filter contains the speech signal component or interference signal. Therefore, even when the noise signal component is far smaller than the speech signal component, i.e., when good signal-to-noise (SN) ratio is expected on the speech input terminal, it is necessary to increase the number of times mo and mi and to reduce the minimum step size so as to insure stable operation. This, however, reduces the converging rate available with the VS algorithm and prevents, when the SN ratio is low, a sufficient noise canceling ability from being achieved.

SUMMARY OF THE INVENTION

It is therefore an object of the present invention to provide a noise canceling method capable of reducing both the converging time and the distortion (residual error) after convergence, and an apparatus therefor.

A noise canceling method of the present invention causes a first adaptive filter to filter, in accordance with a filter coefficient, a reference noise signal input via a reference input terminal to thereby output a pseudonoise signal, causes a subtracter to perform subtraction with the pseudonoise signal and a received signal input via a speech input terminal and consisting of a speech signal and a noise signal to thereby output an error signal, and sequentially corrects the filter coefficient of the first adaptive filter on the basis of the error signal to thereby cause the subtracter to produce the received signal free from background noise. The method has the steps of: detecting error signal power and pseudonoise signal power out of a pseudoerror signal output from a second adaptive filter which has the same configuration as the first adaptive filter and receives the reference noise signal and received signal, estimating the SN power ratio of the received signal from the error signal power and pseudonoise signal power, comparing the estimate of the SN power ratio and a delayed estimate produced by delaying the estimate by a preselected period of time, and outputting greater one of the estimate and delayed estimate as an estimate of an expanded SN power ratio, and varying the filter coefficient of the first adaptive filter adaptively by using a value corresponding to the estimate of the expanded SN power ratio as a correction value.

Also, a noise canceler of the present invention includes a first delay circuit for delaying a received signal input via a speech input terminal and consisting of a speech signal and a noise signal by a first preselected period of tim. A second delay circuit delays a reference noise signal input via a reference input terminal by a second period of time. A first adaptive filter filters a delayed reference noise signal output from the second delay circuit and a first error signal in accordance with a filter coefficient to thereby output a pseudonoise signal. A first subtracter subtracts the pseudonoise signal from the delayed received signal output from the first delay circuit to thereby feed the resulting difference signal to the first adaptive filter as the first error signal, while producing the received signal having background noise cancelled on an output terminal. SN power ratio estimating circuitry outputs, in response to the reference noise signal input via the reference input terminal and the received signal input via the speech input terminal, an estimate of an SN power ratio of the received signal. A third delay circuit delays the estimate output from the SN power ratio estimating circuitry by a third preselected period of time. A comparator compares the estimate input to the third delay circuit and a delayed estimate output from the third delay circuit to thereby output greater one of the estimate and delayed estimate as an estimated of an expanded SN power ratio. A step size output circuit outputs, based on the estimate of the expanded SN power ratio, a step size for determining a correction value of the filter coefficient of the first adaptive filter.

BRIEF DESCRIPTION OF THE DRAWINGS

The above and other objects, features and advantages of the present invention will become apparent from the following detailed description taken with the accompanying drawings in which.

DESCRIPTION OF THE PREFERRED EMBODIMENT

Figure 1:
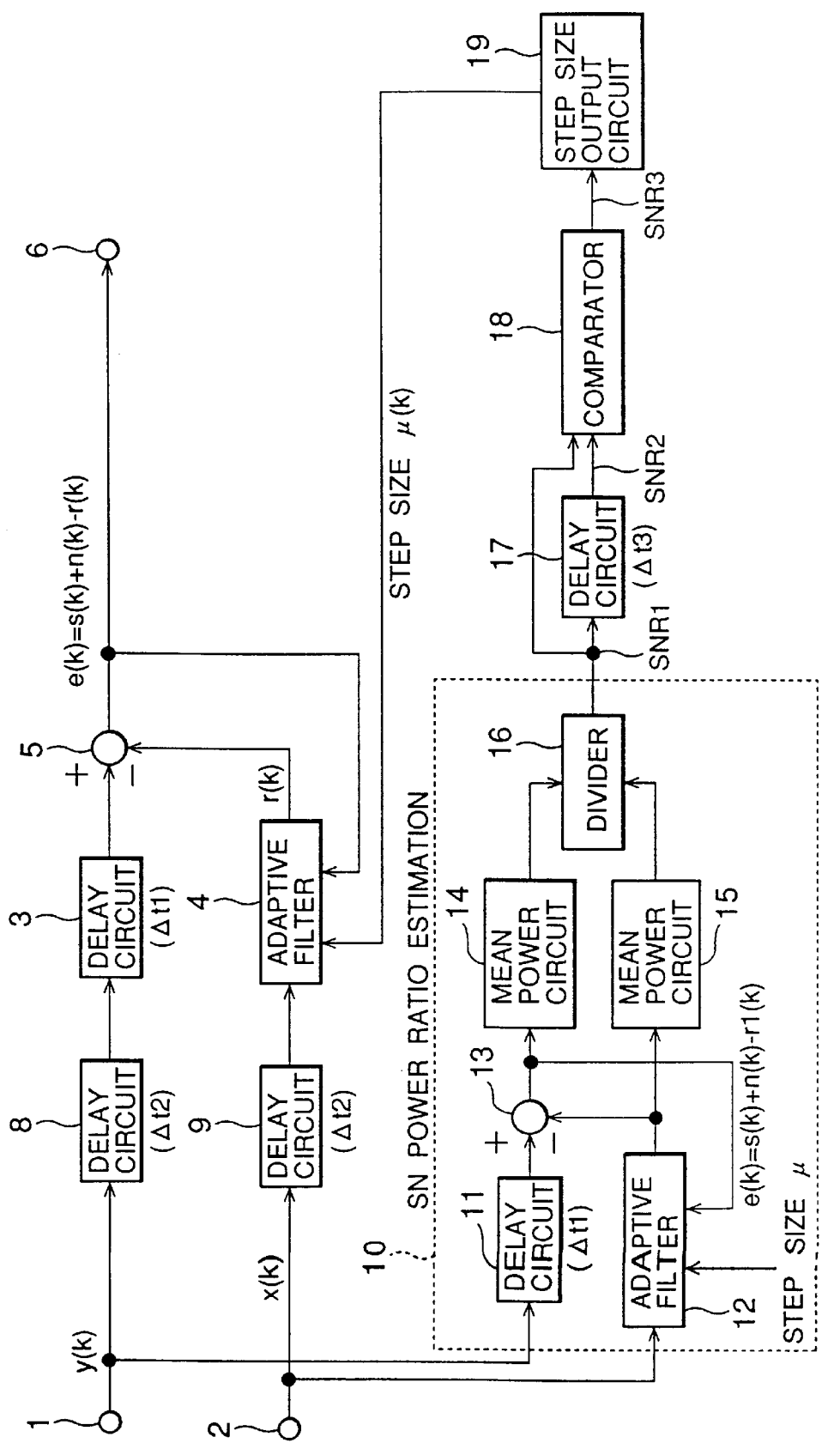
FIG. 1 is a block diagram schematically showing a noise canceler embodying the present invention.
Figure 3:
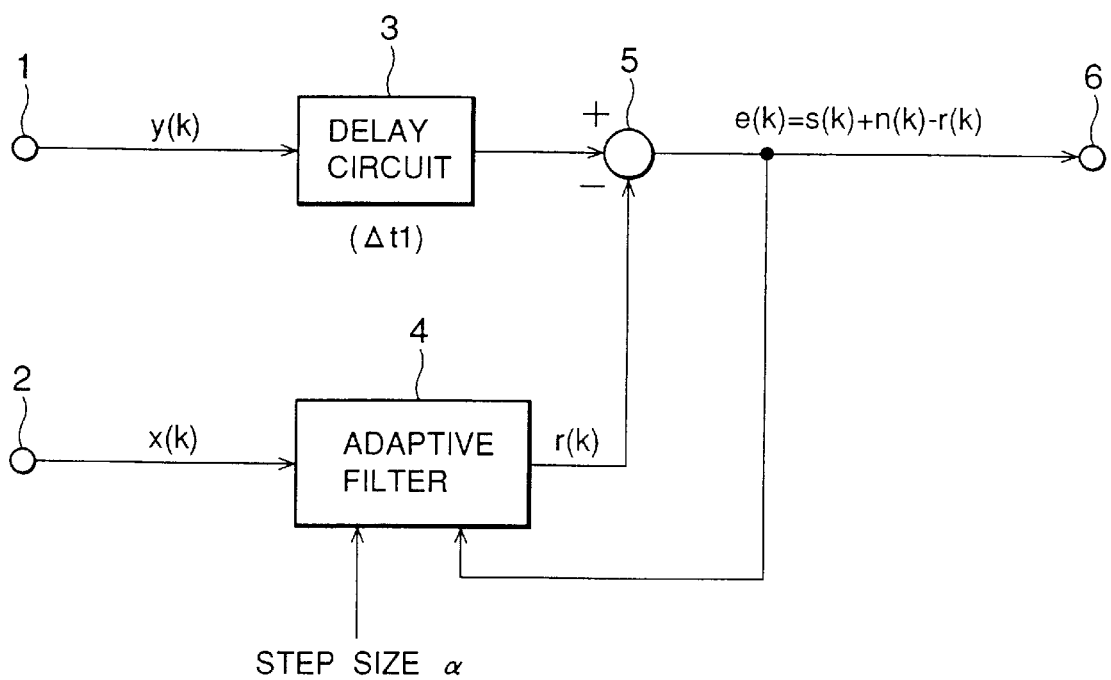
FIG. 3 is a schematic block diagram showing a conventional noise canceler.

Referring to FIG. 1, a noise canceler embodying the present invention is shown. In FIG. 1, the same constituent parts as the parts shown in FIG. 3 are designated by identical reference numerals. As shown, the noise canceler includes an adaptive filter 4. The adaptive filter 4 has its step size controlled by delay circuits 8 and 9, an SN power ratio estimation 10, a delay circuit 17, a comparator 18, and a step size output circuit 19.

The SN power ratio estimation 10 is made up of a delay circuit 11, an adaptive filter 12, a subtracter 13, mean power circuits 14 and 15, and a divider 16. A received signal y(k) is input to the delay circuit 11 via a speech input terminal 1 while a reference noise signal x(k) is input to the adaptive filter 12 via a reference input terminal 2. The subtracter 13 performs subtraction with the output signal of the delay circuit 11 and a pseudonoise signal r1(k) output from the adaptive filter 12. The mean power circuits 14 and 15 respectively produce mean power of the output signal of the subtracter 13 and mean power of the output signal of the adaptive filter 12. The divider 16 divides the output signal of the mean power circuit 15 by the output signal of the mean power circuit 14.

The operation of the SN power ratio estimation 10 will be described first. The adaptive filter 12 generates a pseudonoise signal in response to the reference noise signal x(k) and a difference signal output from the subtracter 13. The delay circuit 11 delays the received signal y(k) by a delay of Δt1 and is inserted to compensate for causality like a delay circuit 3. The subtracter 13 subtracts the pseudonoise signal output from the adaptive filter 12 from a delayed received signal output from the delay circuit 11. The resulting difference or error is fed from the subtracter 13 to the adaptive filter 12 as an error signal.

In the illustrative embodiment, a relatively great step size is selected for updating the coefficient of the adaptive filter 12 in order to increase the converging rate. When use is made of the previously mentioned LIM of Document 2 as an algorithm for updating the coefficient, the step size, labeled $\mu$, is selected to be about 0.2 to 0.5 by way of example.

Assume that the delay Δt1 set in the delay circuit 11 is zero, as in the conventional arrangement. Then, an error signal e1(k) output from the subtracter 13 is expressed as:

$$e1(k)=y(k)-r1(k) \qquad (6)$$

Because the received signal y(k) is the sum of a speech signal s(k) and a noise signal n(k), as represented by the equation (1), the equation (6) may be rewritten as:

$$e1(k)=s(k)+n(k)-r1(k) \qquad (7)$$

The error signal e1(k) is fed from the subtracter 13 to the adaptive filter 12 in order to update the coefficient, and fed to the mean power circuit 14 also. The mean power circuit 14 squares the error signal e1(k) so as to produce a time mean thereof. Specifically, the square $e1^2(k)$ of the error signal is expressed as:

$$e1^2(k)=\{s(k)+n(k)-r1(k)\}^2 \qquad (8)$$

The mean power circuit 14 produces a time mean of such squares $e1^2(k)$. Let the time mean be approximated by an expected value $E[e1^2(k)]$. Then, because the speech signal s(k) and reference noise signal x(k), i.e., the speech signal s(k) and noise signal n(k) are independent of each other, the expected value $E[e1^2(k)]$ is produced by:

$$E[e1^2(k)]=E[s^2(k)+E[\{n(k)-r1(k)\}^2] \qquad (9)$$

In the equation (9), the second member of the right term is representative of a residual error component. Therefore, considering that the residual error component is caused to rapidly converge by the relatively great step size, it is attenuated at a high rate. As a result, the following equation is obtained:

$$E[e1^2(k)] \approx E[s^2(k)] \qquad (10)$$

It follows that the output signal of the mean power circuit 14 approximates the speech signal power $s^2(k)$, as indicated by the equation (10).

On the other hand, the mean power circuit 15 squares the pseudonoise signal r1(k) output from the adaptive filter 12 so as to produce a time mean thereof. The relatively great step size assigned to the adaptive filter 12 implements fast convergence and allows the following equation to hold:

$$r1(k) \approx n(k) \qquad (11)$$

Therefore, the square $r1^2$ of the pseudonoise signal r1(k) has an expected value $E[r1^2(k)]$ approximated by:

$$E[r1^2(k)] \approx E[n^2(k)] \qquad (12)$$

The output signal of the mean power circuit 15 therefore approximates the noise signal power $n^2(k)$. The divider 16 divides the speech signal power output from the mean power circuit 14 by the noise signal power output from the mean power circuit 15 and thereby produces an estimated SN power ratio SNR1.

Assume that a moving average method, for example, is applied to the operation of the mean power circuits 14 and 15. Then, the mean power values output from the mean power circuits 14 and 15 would each involve a delay of Δav with respect to the actual variation of power; the delay Δ depends on the number of times of averaging. This embodiment corrects the delay Δav with the delay circuits 9 and 8. The delay circuit 9 is connected to the input terminal of adaptive filter 4 in order to delay the reference noise signal to be input to the filter 4 by Δt2. Likewise, the delay circuit 8 is connected to the input terminal of a delay circuit 3 in order to delay the received signal to be input to the circuit 3 by Δt2.

Usually, the delay Δt2 is selected to be equal to or greater than the delay Δav. If the delay Δ is greater than the delay Δav, then the variation of the SN power ratio SNRI will be detected earlier than the SNR value of the actual received signal input to the subtracter 5, i.e., SNR1 will be expanded to the negative side with respect to time. It is to be noted that the delay circuits 8 and 3 may be implemented as a single delay circuit capable of providing a delay of (Δt2+Δt1), if desired.

As stated above, the SN power ratio estimation 10 receives the received signal input via the speech input terminal 1 and the reference noise signal input via the reference signal input terminal 2. In response, the estimation 10 causes the adaptive filter 12 to output a pseudonoise signal. Subsequently, the estimation 10 detects error signal power and pseudonoise signal power on the basis of the pseudonoise signal as well as other signals, and outputs an estimated SN power ratio SNR1.

How the delay circuits 8, 9 and 17 and comparator 18 operate will be described specifically. The delay circuit 17 delays the estimated SN power ratio SNR1 output from the estimation 10 by Δt3. The comparator 18 compares the estimated SN power ratio SNR1 bypassed the delay circuit 17 and a delayed estimated SN power ratio SNR2 output from the delay circuit 17. The comparator 18 outputs greater one of the input values SNR1 and SNR2 as an estimate SNR3.

Figure 2:
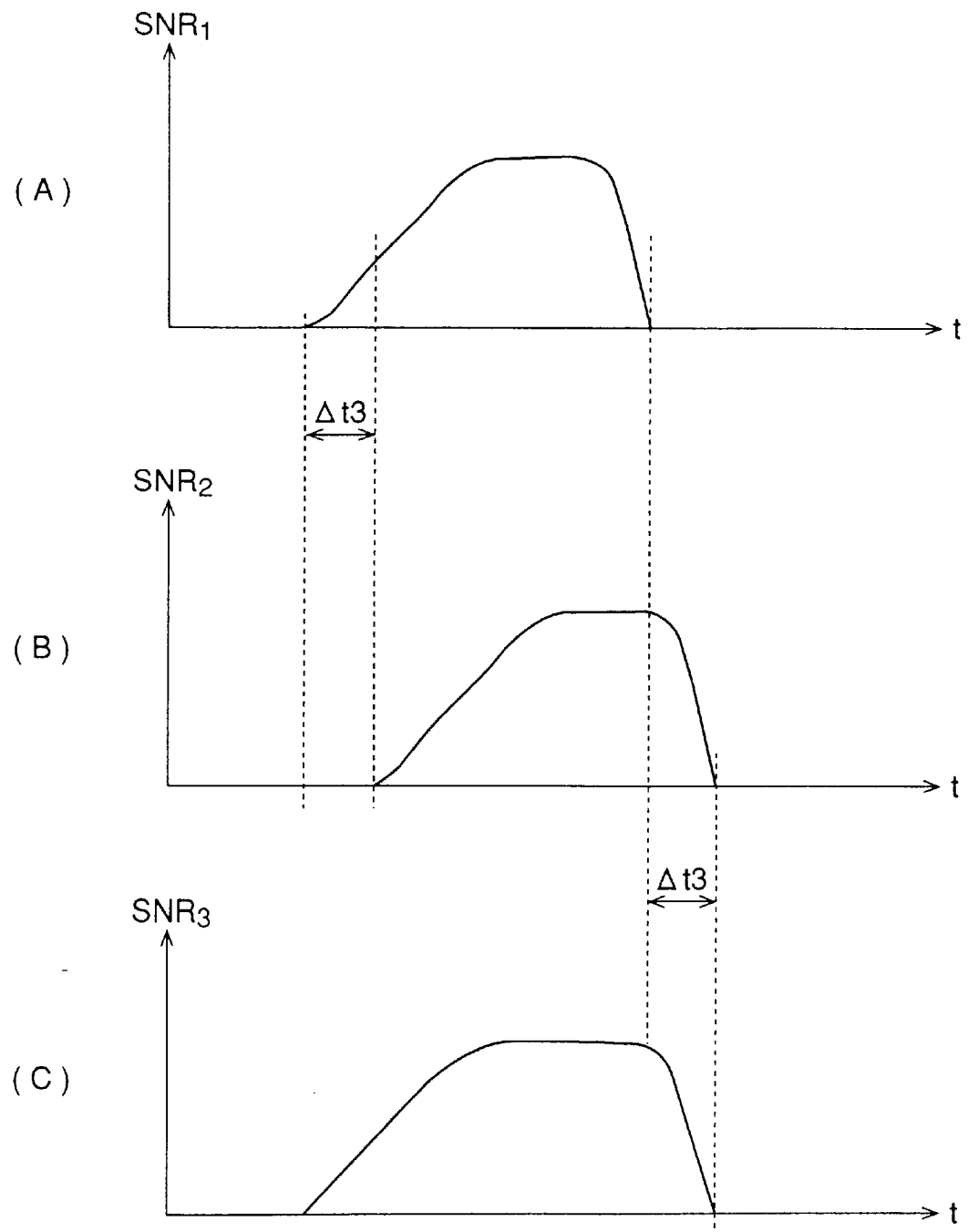
FIG. 2 shows specific waveforms representative of the expansion of the estimate of an SN power ratio with respect to time.

FIG. 2 models a relation between the above three estimates SNR1, SNR2 and NR3. In FIG. 2, a waveform (A) is representative of the estimate SNR1 output from the estimation 10. When the estimate SNR1 is delayed by the delay circuit 17 by Δt3, it turns out the estimate SNR2 represented by a waveform (B). As a result, the comparator 18 outputs the estimate SNR3 represented by a waveform (C). It will be seen that the estimate SNR3 is expanded by Δt3 in the positive direction with respect to time, compared to the estimate SNR1.

The step size output circuit 19 receives the estimate SNR3 from the comparator 18, and outputs a value corresponding to SNR3 as a step size for the adaptive filter 4. At this instant, the output circuit 19 produces a relatively small step size when the estimate SNR3 is relatively small, or produces a relatively great step size when SNR3 is relatively small. For example, assume that the estimate SNR3 has a value SNR3 (k) at a time k, and that the step size at the time k is $\mu(k)$. Then, the relation between SNR3(k) and $\mu(k)$ is expressed as:

$$\mu(k)=\text{clip}[\mu o \cdot 1/SNR3(k), \mu\text{max}, \mu\text{min}] \quad (13)$$

where $\mu o$ is a constant between, e.g., 0.1 and 0.5. In the above equation (13), clip[a, b, c] is a relation for setting the minimum and maximum values and is expressed as:

$$\text{clip}[a, b, c]=a \ (c \leq a \leq b) \quad (14a)$$

$$\text{clip}[a, b, c]=b \ (a>b) \quad (14b)$$

$$\text{clip}[a, b, c]=c \ (a<c) \quad (14c)$$

Assuming $\mu o=0.1$, $\mu\text{max}=0/5$, and $\mu\text{min}=0.01$, then the equation (13) may be rewritten as:

$$\mu(k)=\text{clip}[0.1/SNR3(k), 0.5, 0.01] \quad (15)$$

Therefore, when the estimated SNR3 is 0 dB, i.e., when SNR3(k) is 1, the step size is 0.1, as produced by the above equation (14a). When the estimate SNR3 is 10 dB, i.e., when SNR3(k) is 10, the step size is 0.01, as also produced by the equation (14a). However, when the estimate SNR3 is -10 dB, i.e., when SNR3(k) is 0.1, the step size is determined to be 0.5 by the equation (14b) due to the limited maximum value. Likewise, when the estimate SNR3 is 20 dB, i.e., when SNR3(k) is 100, the step size is determined to be 0.01 by the equation (14c) due to the limited minimum value. Such a range in which the step size is confined allows the adaptive filter to operate stably.

In the manner described above, the delay circuit 17 and comparator 18 expand the estimate SNR1 output from the SN power ratio estimation to thereby output the estimate SNR3. The step size output circuit 19 controls the step size meant for the adaptive filter 4 in accordance with the estimate SNR3 fed thereto.

As stated above, the illustrative embodiment controls the step size meant for the adaptive filter 4 on the basis of the estimate SNR3. Therefore, in a period wherein a speech signal is absent or is far smaller than a noise signal component, the step size can be increased in order to promote rapid convergence without being effected by an interference signal. Also, in a period wherein a speech signal component is greater than a noise signal component, the step size can be reduced in order to prevent a residual error ascribable to the interference signal from increasing.

In the embodiment, the estimate SNR3 is expanded in the negative direction with respect to time by the delay circuits 8 and 9, and expanded in the positive direction by the delay circuit 17. Therefore, it is possible to reduce the step size sufficiently before the start of a speech signal, and to increase the step size after the end of the speech signal. This allows the filter coefficient assigned to the adaptive filter 4 to converge stably.

In summary, in accordance with the present invention, a relation in size between a speech signal and a noise signa to be cancelled is determined on the basis of the estimate of an expanded SN power ratio; the speech signal is an interference signal component when it comes to the updating of the coefficient of an adaptive filter. A value corresponding to the estimate is used to vary the filter coefficient of a first adaptive filter adaptively. As a result, both the increase in converging rate and the decrease in residual error are achieved at the same time.

Further, the estimate of the expanded SN power ratio has a period wherein the SN power ratio is greatly extended with respect to time. Consequently, the step size is increased when the speech signal is sufficiently small, insuring stable convergence of the coefficient.

Moreover, a second delay time for delaying a reference noise signal input to the first adaptive filter is selected to be equal to or greater than a period of timer necessary for SN power estimation circuitry to compute an estimated SN power ratio. This allows the variation of the estimated SI power ratio output from the SN power ratio estimation circuitry to be detected earlier than the actual value of a received signal input to a first subtracter. Therefore, the step size can be reduce to a sufficient degree before the start of a speech signal.

What is claimed is:

1. A noise canceling method for causing a first adaptive filter to filter, in accordance with a filter coefficient, a reference noise signal input via a reference input terminal to thereby output a pseudonoise signal, causing a subtracter to perform subtraction with said pseudonoise signal and a received signal input via a speech input terminal and consisting of a speech signal and a noise signal to thereby output an error signal, and sequentially correcting the filter coefficient of said first adaptive filter on a basis of said error signal to thereby cause said subtracter to produce the received signal free from background noise, said method comprising the steps of:

detecting error signal power and pseudonoise signal power out of a pseudoerror signal output from a second adaptive filter which has a same configuration as said first adaptive filter and receives the reference noise signal and the received signal;

estimating a signal to noise power ratio of the received signal from said error signal power and said pseudonoise signal power;

comparing an estimate of said signal to noise power ratio and a delayed estimate produced by delaying said estimate by a preselected period of time, and outputting greater one of said estimate and said delayed estimate as an estimate of an expanded signal to noise power ratio; and varying the filter coefficient of said first adaptive filter adaptively by using a value corresponding to said estimate of said expanded signal to noise power ratio as a correction value.

2. A noise canceler comprising:

a first delay circuit for delaying a received signal input via a speech input terminal and consisting of a speech signal and a noise signal by a first preselected period of time;

a second delay circuit for delaying a reference noise signal input via a reference input terminal by a second period of time;

a first adaptive filter for filtering a delayed reference noise signal output from said second delay circuit and a first error signal in accordance with a filter coefficient to thereby output a pseudonoise signal;

a first substracter for subtracting said pseudonoise signal from said delayed received signal output from said first delay circuit to thereby feed a resulting difference signal to said first adaptive filter as said first error signal, while producing the received signal having background noise cancelled on an output terminal;

signal to noise power ratio estimating circuitry for outputting, in response to the reference noise signal input via said reference input terminal and the received signal input via said speech input terminal, an estimate of a signal to noise power ratio of the received signal;

a third delay circuit for delaying said estimate output from said signal to noise power ratio estimating circuitry by a third preselected period of time;

a comparator for comparing said estimate input to said third delay circuit and a delayed estimate output from said third delay circuit to thereby output greater one of said estimate and said delayed estimate as an estimate of an expanded signal to noise power ratio; and a step size output circuit for outputting, based on said estimate of said expanded signal to noise power ratio, a step size for determining a correction value of the filter coefficient of said first adaptive filter.

3. A noise canceler as claimed in claim 2, wherein said signal to noise power ratio estimating circuitry comprises:

a fourth delay circuit for delaying the received signal input via said speech input terminal by a fourth period of time;

a second adaptive filter for filtering the reference noise signal input via said reference input terminal and a second error signal in accordance with a filter coefficient to thereby output a second pseudonoise signal;

a second substracter for subtracting said second pseudonoise signal from a delayed received signal output from said fourth delay circuit, and feeding a resulting difference signal to said second adaptive filter as said second error signal;

a first mean power circuit for producing a square mean of said second error signal to thereby output received signal power;

a second mean power circuit for producing a square mean of said second pseudonoise signal to thereby output noise signal power; and a divider for dividing said received signal power by said noise signal power to thereby output an estimate of a signal to noise power ratio of the received signal.

4. A noise canceler as claimed in claim 2, wherein said step size output circuit outputs, when a product of a reciprocal of said estimate of said expanded signal to noise power ratio output from said comparator and a preselected coefficient lies in a range between a preselected maximum value and a preselected minimum value, said product as a step size for determining an amount of correction of the filter coefficient of said first adaptive filter, or outputs, when said product is greater than said preselected maximum value, said maximum value as said step size, or outputs, when said product is smaller than said preselected minimum value, said minimum value as said step size.

5. A noise canceler as claimed in claim 2, wherein said second period of time is equal to or greater than a period of time necessary for said signal to noise power ratio estimating circuitry to compute said estimate of said signal to noise power ratio, and wherein said first period of time is longer than said second period of time.

6. A noise canceler as claimed in claim 3, wherein said fourth period of time is equal to a period of time produced by subtracting said second period of time from said first period of time.

* * * * *